United States Patent
Park et al.

(10) Patent No.: US 8,815,663 B2
(45) Date of Patent: Aug. 26, 2014

(54) METHOD OF MANUFACTURING THIN FILM TRANSISTOR, THIN FILM TRANSISTOR MANUFACTURED USING THE METHOD, METHOD OF MANUFACTURING ORGANIC LIGHT-EMITTING DISPLAY APPARATUS, AND ORGANIC LIGHT-EMITTING DISPLAY APPARATUS MANUFACTURED USING THE METHOD

(75) Inventors: Byoung-Keon Park, Yongin (KR);
Jong-Ryuk Park, Yongin (KR);
Tak-Young Lee, Yongin (KR);
Jin-Wook Seo, Yongin (KR); Ki-Yong Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 257 days.

(21) Appl. No.: 13/313,555

(22) Filed: Dec. 7, 2011

(65) Prior Publication Data
US 2012/0326157 A1    Dec. 27, 2012

(30) Foreign Application Priority Data
Jun. 21, 2011    (KR) .................. 10-2011-0060231

(51) Int. Cl.
| | | |
|---|---|---|
| H01L 29/786 | (2006.01) | |
| H01L 33/08 | (2010.01) | |
| H01L 33/16 | (2010.01) | |
| H01L 21/336 | (2006.01) | |

(52) U.S. Cl.
USPC ........ 438/166; 257/72; 257/66; 257/E21.413; 257/E29.293; 257/E33.003; 438/164; 438/151; 438/142; 438/689; 438/706

(58) Field of Classification Search
USPC .............. 257/72, 66, E21.413, E29.293, 257/E33.003, E33.053; 438/166, 164, 149, 438/151, 142, 689, 706
See application file for complete search history.

(56) References Cited

U.S. PATENT DOCUMENTS

| | | | | |
|---|---|---|---|---|
| 4,466,176 | A * | 8/1984 | Temple | 438/138 |
| 6,156,583 | A | 12/2000 | Hwang | |
| 7,011,996 | B2 * | 3/2006 | Okumura et al. | 438/164 |
| 7,098,091 | B2 * | 8/2006 | Chen | 438/158 |

(Continued)

FOREIGN PATENT DOCUMENTS

| | | |
|---|---|---|
| KR | 2000-0001758 | 1/2000 |
| KR | 10-2003-0092873 | 12/2003 |

(Continued)

*Primary Examiner* — Lex Malsawma
*Assistant Examiner* — Sheng Zhu
(74) *Attorney, Agent, or Firm* — Robert E. Bushnell, Esq.

(57) ABSTRACT

A method of manufacturing a TFT, including forming a buffer layer, an amorphous silicon layer, an insulating layer, and a first conductive layer on a substrate, forming a polycrystalline silicon layer by crystallizing the amorphous silicon layer, forming a semiconductor layer, a gate insulating layer, and a gate electrode that have a predetermined shape by simultaneously patterning the polycrystalline silicon layer, the insulating layer, and the first conductive layer, wherein the polycrystalline silicon layer is further etched to produce an undercut recessed a distance compared to sidewalls of the insulating layer and the first conductive layer, forming source and drain regions within the semiconductor layer by doping corresponding portions of the semiconductor layer, forming an interlayer insulating layer on the gate electrode, the interlayer insulating layer covering the gate insulating layer and forming source and drain electrodes that are electrically connected to source and drain regions respectively.

18 Claims, 11 Drawing Sheets

(56) References Cited

U.S. PATENT DOCUMENTS

| | | | |
|---|---|---|---|
| 7,166,959 B2 * | 1/2007 | Suzuki et al. | 313/504 |
| 7,781,272 B2 * | 8/2010 | Li | 438/155 |
| 2009/0087976 A1 * | 4/2009 | Hendriks et al. | 438/593 |

FOREIGN PATENT DOCUMENTS

| | | |
|---|---|---|
| KR | 10-2004-0067513 | 7/2004 |
| KR | 10-2006-0113585 | 11/2006 |
| KR | 10-2010-0061977 | 6/2010 |

* cited by examiner

METHOD OF MANUFACTURING THIN FILM TRANSISTOR, THIN FILM TRANSISTOR MANUFACTURED USING THE METHOD, METHOD OF MANUFACTURING ORGANIC LIGHT-EMITTING DISPLAY APPARATUS, AND ORGANIC LIGHT-EMITTING DISPLAY APPARATUS MANUFACTURED USING THE METHOD

CLAIM OF PRIORITY

This application makes reference to, incorporates the same herein, and claims all benefits accruing under 35 U.S.C. §119 from an application earlier filed in the Korean Intellectual Property Office on the 21 Jun. 2011 and there duly assigned Serial No. 10-2011-0060231.

BACKGROUND OF THE INVENTION

1. Field of the Invention

The present invention relates to a method of manufacturing a thin film transistor (TFT) having a uniform characteristics and of which a manufacturing process is simplified, a TFT manufactured using the method, a method of manufacturing an organic light-emitting display apparatus that includes the TFT, and an organic light-emitting display apparatus manufactured using the method of manufacturing an organic light-emitting display apparatus.

2. Description of the Related Art

In general, a thin film transistor (TFT) including a polycrystalline silicon layer is characterized as having excellent electron mobility and an ability to configure a complementary metal-oxide-semiconductor (CMOS) circuit, so that the TFT can be used in a switching device of a high-definition (HD) display panel, a projection panel requiring a high amount of light, or the like.

According to the related art, a TFT is manufactured in a manner that an amorphous silicon layer is formed on a substrate, the amorphous silicon layer is crystallized into a polycrystalline silicon layer, and then the polycrystalline silicon layer is patterned into a predetermined shape to produce a semiconductor layer. Afterward, a gate insulating layer is formed to completely cover the semiconductor layer, and a gate electrode is formed on the gate insulating layer. However, in the manufacturing method according to the related art, various processes have to be performed from the formation of the amorphous silicon layer to the formation of the gate electrode, so that the manufacturing method is complicated and the manufacturing time is increased.

Also, according to the related art, a crystallization process is performed while the amorphous silicon is exposed to air. Also, in a process in which the polycrystalline silicon layer is patterned into a predetermined shape, the polycrystalline silicon layer contacts photoresist (PR). In this regard, the amorphous silicon layer or the polycrystalline silicon layer in the crystallization process and the patterning process may be contaminated, so that the TFT does not exhibit uniform characteristics but has a distribution of characteristics.

The aforementioned description of the related art is technical information that is retained by the inventor so as to derive the invention or that is obtained by the invention when the inventor derives the invention, so that the technical information may not be prior art under 35 U.S.C. 102.

SUMMARY OF THE INVENTION

The present invention provides a method of manufacturing a thin film transistor (TFT) by simultaneously patterning a buffer layer, an silicon layer, a gate insulating layer, and a gate electrode; a TFT manufactured using the method; a method of manufacturing an organic light-emitting display apparatus; and an organic light-emitting display apparatus manufactured using the method of manufacturing an organic light-emitting display apparatus.

According to an aspect of the present invention, there is provided a method of manufacturing a thin film transistor (TFT), the method including forming a buffer layer, an amorphous silicon layer, an insulating layer, and a first conductive layer on a substrate, forming a polycrystalline silicon layer by crystallizing the amorphous silicon layer, forming a semiconductor layer, a gate insulating layer, and a gate electrode that have a predetermined shape by simultaneously patterning the polycrystalline silicon layer, the insulating layer, and the first conductive layer, wherein the polycrystalline silicon layer is further etched to produce an undercut recessed a distance compared to sidewalls of the insulating layer and the first conductive layer, forming a source region and a drain region within the semiconductor layer by doping corresponding portions of the semiconductor layer, forming an interlayer insulating layer on the gate electrode, the interlayer insulating layer covering the gate insulating layer and forming a source electrode and a drain electrode that are electrically connected to the source region and the drain region respectively.

A width of the gate electrode may be greater than a width of the semiconductor layer in a direction (a Y-axis direction) orthogonal to a direction (an X-axis direction) that the source region, a channel region and the drain region are arranged. The forming of the semiconductor layer, the gate insulating layer, and the gate electrode includes using a half-tone mask including light-transflecting portions arranged at locations that correspond to the source region and the drain region, respectively. The gate electrode may correspond to an undoped channel region of the semiconductor layer and may serve as a doping mask during the doping of the semiconductor layer. The forming of the source and drain electrodes may include exposing the source and drain regions by forming contact holes in the interlayer insulating layer and in the gate insulating layer, forming a second conductive layer on the interlayer insulating layer and within the contact holes and patterning the second conductive layer. The deposition of the buffer layer, the amorphous silicon layer, the insulating layer, and the first conductive layer on the substrate may be performed via a single deposition process. The amorphous silicon layer may be crystallized into the polycrystalline silicon layer via one of a Solid Phase Crystallization (SPC) process, a Metal-Induced Crystallization (MIC) process, a Super Grain Silicon (SGS) crystallization process, and a Joule-heating Induced Crystallization (JIC) process.

According to another aspect of the present invention, there is provided a thin film transistor (TFT) that includes a substrate, a semiconductor layer arranged on the substrate and including a channel region and source and drain regions arranged at opposite sides of the channel region, a gate insulating layer arranged on the semiconductor layer, a gate electrode arranged on the gate insulating layer, wherein a width of the gate electrode is greater than a width of the semiconductor layer in a direction (a Y-axis direction) orthogonal to a direction (an X-axis direction) that the source region, the channel region and the drain region are arranged, an interlayer insulating layer arranged on the gate insulating layer to cover the gate electrode and a source electrode and a drain electrode arranged on the interlayer insulating layer and electrically connected to the source region and the drain region respectively. The source region and the drain region may be arranged in portions of the semiconductor layer that is not overlapped by the gate electrode.

According to yet another aspect of the present invention, there is provided a method of manufacturing an organic light-emitting display apparatus, including forming a buffer layer, an amorphous silicon layer, an insulating layer, and a first conductive layer on a substrate, forming a polycrystalline silicon layer by crystallizing the amorphous silicon layer, forming a semiconductor layer, a gate insulating layer, and a gate electrode that have a predetermined shape by simultaneously patterning the polycrystalline silicon layer, the insulating layer, and the first conductive layer, wherein the polycrystalline silicon layer is further etched laterally to produce an undercut recessed by a predetermined distance as compared to corresponding sidewalls of the insulating layer and the first conductive layer, forming a source region and a drain region in the semiconductor layer by doping corresponding portions of the semiconductor layer, forming an interlayer insulating layer on the gate electrode to cover the gate insulating layer, forming a source electrode and a drain electrode that are electrically connected to the source region and the drain region respectively, forming a pixel electrode that is electrically connected to one of the source electrode and the drain electrode, forming an intermediate layer on the pixel electrode, the intermediate layer including an emission layer (EML) and forming an opposite electrode on the intermediate layer.

A width of the gate electrode may be greater than a width of the semiconductor layer in a direction (a Y-axis direction) orthogonal to a direction that the source region, a channel region and the drain region are arranged. The forming of the semiconductor layer, the gate insulating layer, and the gate electrode may include using a half-tone mask comprising light-transflecting portions arranged at locations that correspond to the source region and the drain region, respectively. The gate electrode may be arranged to correspond to an undoped channel region of the semiconductor layer and serve as a doping mask during the doping of the semiconductor layer. The forming of the source electrode and the drain electrode may include exposing the source and drain regions by forming contact holes in the interlayer insulating layer and in the gate insulating layer, forming a second conductive layer on the interlayer insulating layer and within the contact holes and patterning the second conductive layer. The forming of the pixel electrode may include forming a planarization layer on the interlayer insulating layer to cover the source electrode and the drain electrode, exposing one of the source electrode and the drain electrode by forming a via-hole in the planarization layer and depositing a metal material on the planarization layer and in the via hole, wherein the pixel electrode is electrically connected to the one of the source electrode and the drain electrode via the via-hole. The depositing of the buffer layer, the amorphous silicon layer, the insulating layer, and the first conductive layer on the substrate may be performed via a single deposition process. The amorphous silicon layer may be crystallized into the polycrystalline silicon layer using via one of a Solid Phase Crystallization (SPC) process, a Metal-Induced Crystallization (MIC) process, a Super Grain Silicon (SGS) crystallization process and a Joule-heating Induced Crystallization (JIC) process.

According to still another aspect of the present invention, there is provided an organic light-emitting display apparatus that includes a substrate, a semiconductor layer arranged on the substrate and including a channel region, and source and drain regions arranged at opposite sides of the channel region, respectively, a gate insulating layer arranged on the semiconductor layer, a gate electrode arranged on the gate insulating layer, wherein a width of the gate electrode is greater than a width of the semiconductor layer in a direction (a Y-axis direction) orthogonal to a direction (an X-axis direction) the source region, the channel region and the drain region are arranged, an interlayer insulating layer arranged on the gate insulating layer to cover the gate electrode, a source electrode and a drain electrode arranged on the interlayer insulating layer and being electrically connected to the source region and the drain region respectively, a pixel electrode electrically connected to one of the source electrode and the drain electrode, an intermediate layer arranged on the pixel electrode and including an emission layer (EML) and an opposite electrode arranged on the intermediate layer. The source region and the drain region may be arranged in regions of the semiconductor layer that are not overlapped by the gate electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown. The invention may, however, be embodied in many different forms, and should not be construed as being limited to the embodiments set forth herein.

FIGS. 1A through 10C are cross-sectional views that schematically illustrate a method of manufacturing a thin film transistor (TFT), according to an embodiment of the present invention.

Figure 1A:
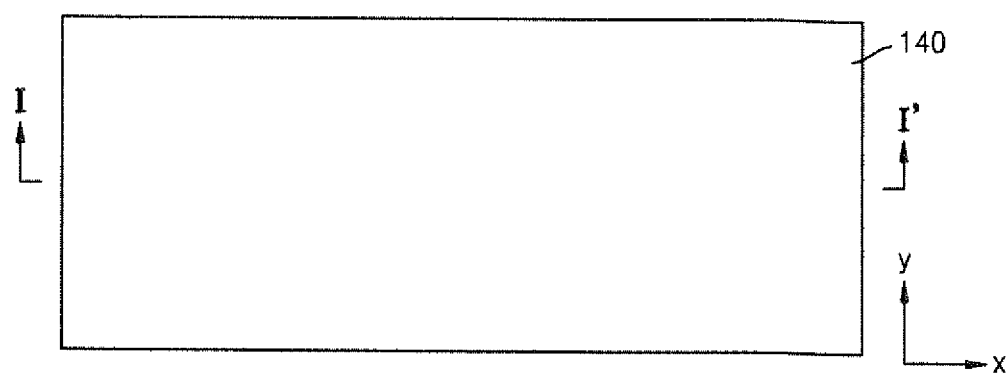
FIGS. 1A through 10C are cross-sectional views that schematically illustrate a method of manufacturing a thin film transistor (TFT), according to an embodiment of the present invention.
Figure 1B:
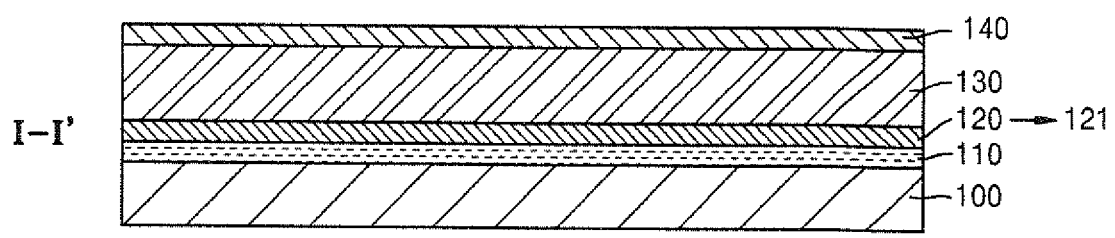

Referring to FIGS. 1A and 1B, an amorphous silicon layer 120, an insulating layer 130, and a first conductive layer 140 are deposited on a substrate 100 via a single process. Afterward, the amorphous silicon layer 120 is crystallized into a polycrystalline silicon layer 121.

In more detail, the substrate 100 may be formed of a transparent glass material containing $SiO_2$ as a main component, but is not limited thereto.

A buffer layer 110 functions to prevent penetration of impurities into the substrate 100 and to planarize a surface of the substrate 100. Also, the buffer layer 110 functions to protect one surface of the amorphous silicon layer 120 which corresponds to the substrate 100. The buffer layer 110 may be made out of at least one of silicon oxide, silicon nitride, and silicon oxynitride.

In general, the amorphous silicon layer 120 is formed by chemical vapor deposition (CVD), and the amorphous silicon layer 120 formed by CVD contains a gas such as hydrogen. The gas may cause a problem by which an electron mobility is decreased, so that a dehydrogenation process may be performed to prevent hydrogen from remaining in the amorphous silicon layer 120. However, the dehydrogenation process is not an essential process and thus may be omitted. In addition, the amorphous silicon layer 120 may be formed of micro-crystal silicon μc-Si, besides amorphous silicon a-Si.

The amorphous silicon layer 120 becomes the polycrystalline silicon layer 121 via a crystallization process. Since the insulating layer 130 is already formed on the amorphous silicon layer 120, it is advantageous to crystallize the amorphous silicon layer 120 by performing a thermal treatment. For example, a method of crystallizing amorphous silicon into polycrystalline silicon includes a Solid Phase Crystallization (SPC) technique, a Metal-Induced Crystallization (MIC) technique, a Super Grain Silicon (SGS) crystallization technique, a Joule-heating Induced Crystallization (JIC) technique, and the like. However, the crystallization method is not limited to the aforementioned methods and thus one of various technique that are well known in the art may instead be used.

The SPC method involves annealing a glass for several hours to several tens of hours at a temperature equal to or less than about 700 C.° at which the glass that forms the substrate 100 is deformed. The MIC technique uses a phenomenon in which, when metal, including nickel, palladium, gold, aluminum and the like, contacts the amorphous silicon layer 120 or is implanted into the amorphous silicon layer 120, the amorphous silicon layer 120 is phase-changed into the polycrystalline silicon layer 121. In order to solve a contamination problem of a metal catalyst in a Metal-Induced Crystallization technique, the SGS crystallization method involves adjusting a size of a crystalline grain containing a metal seed to a level of several to several hundreds of nanometers by adjusting a concentration of the metal catalyst, which diffuses to the amorphous silicon layer 120, to a low level. In SGS crystallization, the crystalline grain radially grows with respect to the metal seed, so that a crystalline growth direction between adjacent crystalline grains is random. The JIC technique involves forming a conduction layer for Joule heating on or below silicon and then crystallizing silicon by using heat that is generated when an intensive electric field is momentarily applied to the conduction layer.

The insulating layer 130 functions to protect the amorphous silicon layer 120 from external contamination in a crystallization process of the amorphous silicon layer 120, and functions to protect the polycrystalline silicon layer 121 by preventing the polycrystalline silicon layer 121 from being directly exposed to photoresist (PR) or to an external environment while a patterning process is performed. Here, the insulating layer 130 may be formed as a single layer or a plurality of layers including an inorganic insulating layer such as silicon oxide, silicon nitride, or the like.

The first conductive layer 140 may include one or more materials selected from the group consisting of Ag, Mg, Al, Pt, Pd, Au, Ni, Nd, Ir, Cr, Li, Ca, Mo, Ti, W, MoW, and Al/Cu, or may include one or more transparent materials selected from the group consisting of ITO, IZO, ZnO, and $In_2O_3$. The first conductive layer 140 becomes a gate electrode 141 of the TFT as described below. In the present embodiment, the first conductive layer 140 is formed as a single layer. However, one or more embodiments are not limited thereto, and the first conductive layer 140 may be formed by stacking a plurality of conductive layers.

According to the present embodiment, the buffer layer 110, the amorphous silicon layer 120, the insulating layer 130, and the first conductive layer 140 are produced simultaneously via a single patterning process, so that the amorphous silicon layer 120 is not exposed to air upon the amorphous silicon layer 120 being crystallized, and thus, the amorphous silicon layer 120 does not get contaminated. By doing so, a distribution of characteristics of the TFT may vanish and electric characteristics thereof may be improved.

Also, according to the present embodiment, because the insulating layer 130 and the amorphous silicon layer 120 are formed together via a single process, photoresist does not directly contact a semiconductor layer 122 (that is, the polycrystalline silicon layer 121) while the semiconductor layer 122 (refer to FIGS. 2A through 2C) and a gate insulating layer 131 (refer to FIGS. 2A through 2C) are formed. Thus, problems of contamination and deterioration in device characteristics, which are caused by direct contact between the photoresist and the semiconductor layer 122, do not occur.

Next, as illustrated in FIGS. 2A through 6C, the polycrystalline silicon layer 121, the insulating layer 130, and the first conductive layer 140 are simultaneously patterned so that the semiconductor layer 122, the gate insulating layer 131, and the gate electrode 141, are formed in a predetermined shape.

Figure 2A:
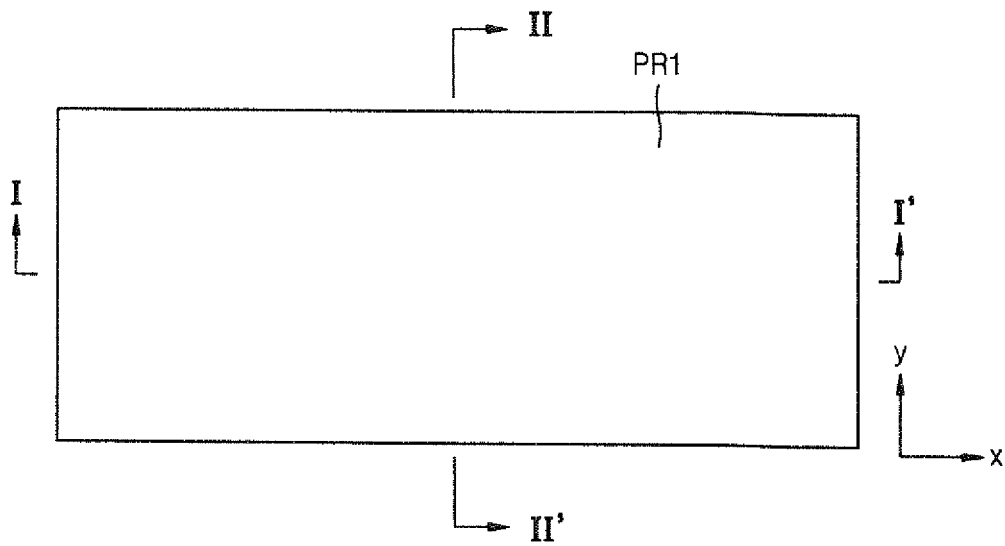
Figure 2B:
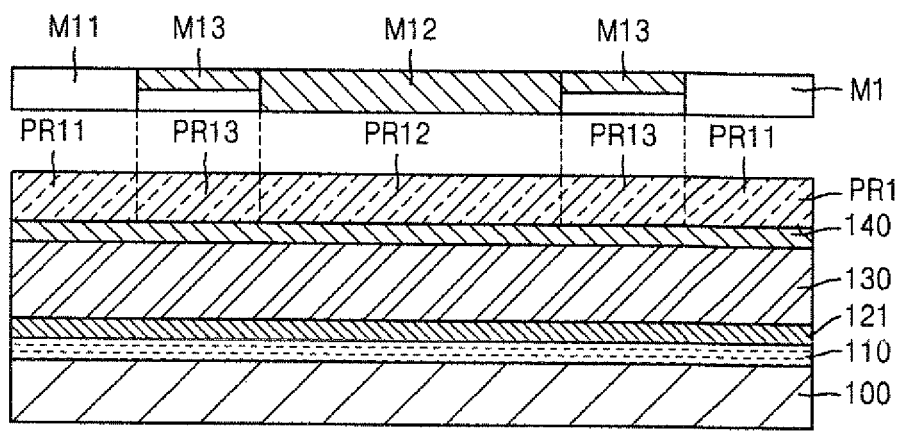
Figure 2C:
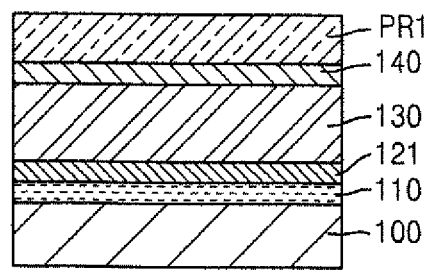

First, referring to FIGS. 2A through 2C, first photoresist PR1 is formed on the first conductive layer 140, and then a first mask M1 having a predetermined pattern is aligned on the substrate 100 to pattern the first photoresist PR1.

Here, the first mask M1 includes a half-tone mask having a light-transmitting portion M11, a light-blocking portion M12, and a light-transflecting portion M13. The light-transmitting portion M11 transmits light having a predetermined wavelength band, the light-blocking portion M12 blocks irradiated light, and the light-transflecting portion M13 partially transmits irradiated light.

The half-tone mask M1 of FIGS. 2A through 2C is conceptually illustrated to describe a function of each portion of the half-tone mask M1. Actually, the half-tone mask M1 may be formed on a transparent substrate including quartz (Qz) and may have a predetermined pattern. Here, the light-blocking portion M12 may be formed by patterning a material including Cr or $CrO_2$ on a quartz substrate, and the light-transflecting portion M13 may adjust transmittance with respect to the irradiated light by adjusting a ratio of composition of components or thicknesses of one or more materials selected from the group consisting of Cr, Si, Mo, Ta, and Al.

The first mask M1 having the aforementioned pattern is aligned on the substrate 100, and then an exposure is performed by irradiating the light having a predetermined wavelength band onto the first photoresist PR1.

Figure 3A:
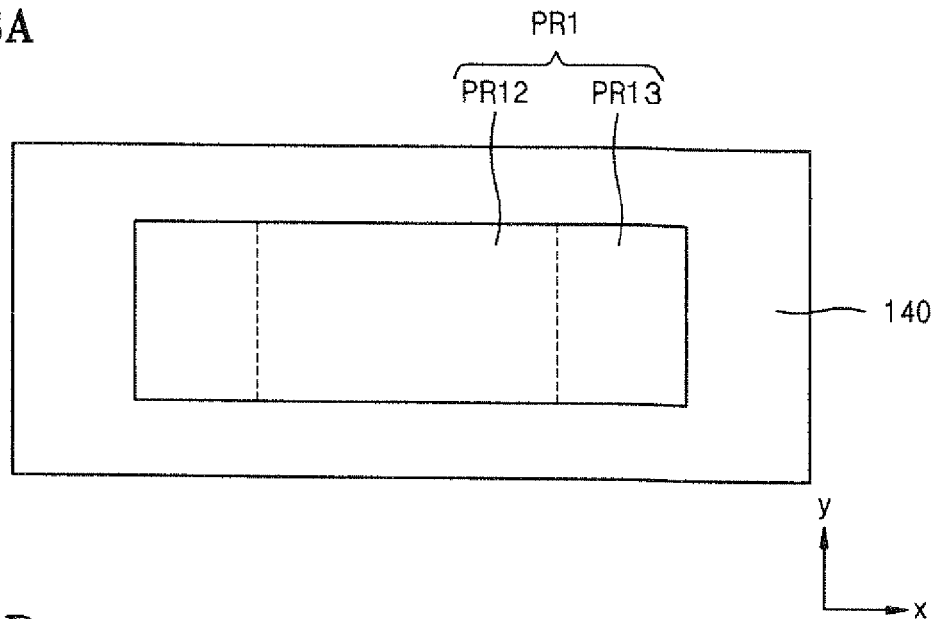
Figure 3B:
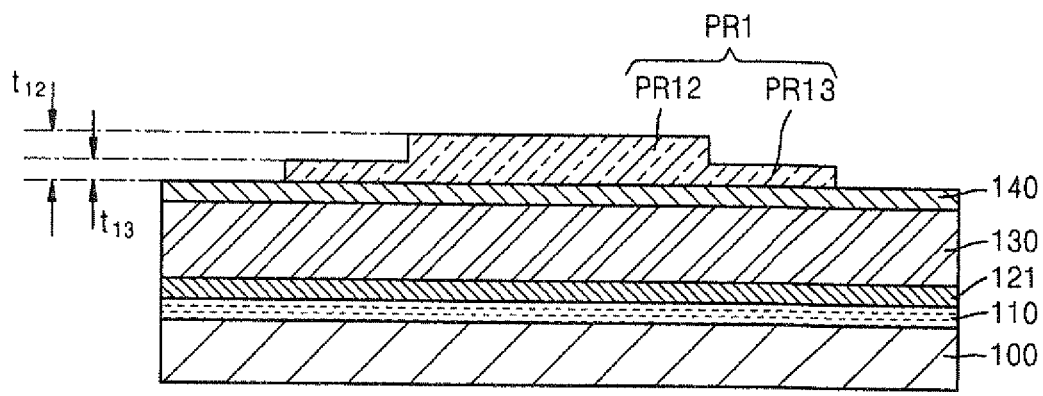
Figure 3C:
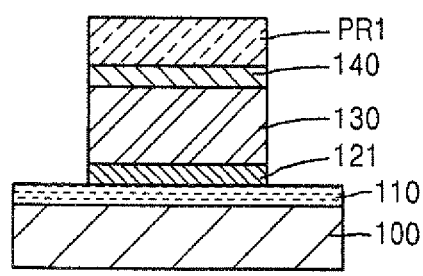

Turning now to FIGS. 3A to 3C, FIGS. 3A through 3C schematically illustrate a pattern of the first photoresist PR1 that remains after a developing process is performed to remove sensitized portions of the first photoresist PR1. In the present embodiment, positive photoresist which has a light-sensitive portion removed is used. However, one or more embodiments are not limited thereto, and negative photoresist may instead be used.

Referring to FIGS. 3A through 3C, a photoresist portion (refer to PR11 of FIGS. 2A through 2C) corresponding to the light-transmitting portion M11 of the half-tone mask M1 is removed, and a photoresist portion PR12 corresponding to the light-blocking portion M12 and a photoresist portion PR13 corresponding to the light-transflecting portion M13 remain. Here, a thickness t13 of the photoresist portion PR13 corresponding to the light-transflecting portion M13 is less than a thickness t12 of the photoresist portion PR12 corresponding to the light-blocking portion M12. The thickness t13 of the photoresist portion PR13 may be varied by adjusting a composition ratio or thicknesses of materials used in light-transflecting portion M13 of mask M1.

By using patterns of the photoresist portions PR12 and PR13 as a mask, an etching equipment etches the polycrystalline silicon layer 121, the insulating layer 130, and the first conductive layer 140 on the substrate 100. In this regard, a structure of a region without a photoresist portion (corresponding to PR11 of FIGS. 2A through 2C) is first etched, and then a thickness of remaining portions of first photoresist PR1 is partly etched. The aforementioned etching process may be performed by one of various methods including a wet etching method and a dry etching method.

Figure 4A:
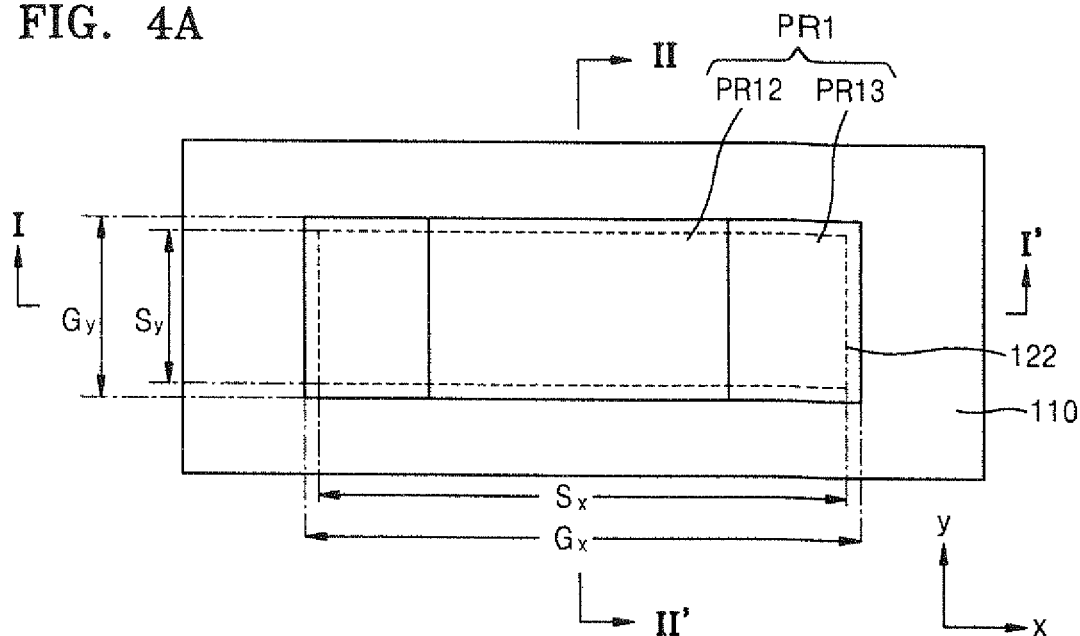
Figure 4B:
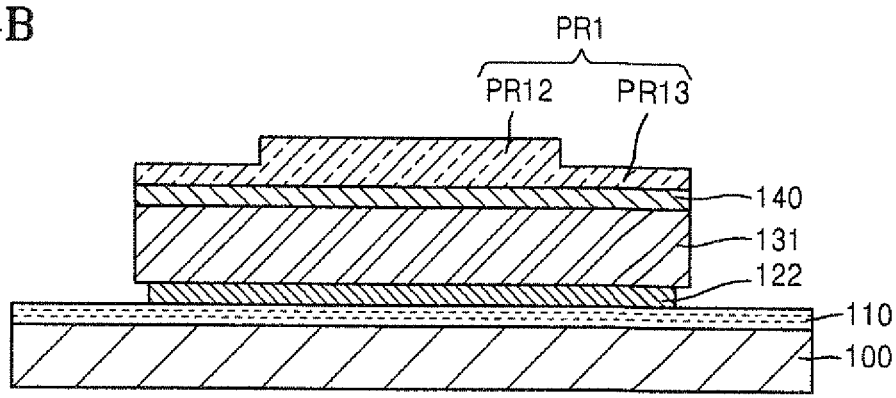
Figure 4C:
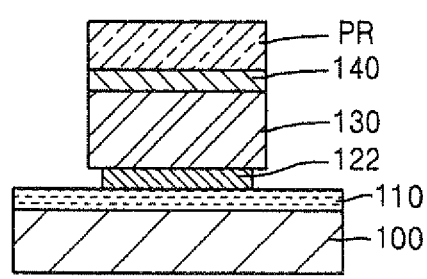

In more detail, referring to FIGS. 4A through 4C, when a first etching process is performed, the polycrystalline silicon layer 121 (refer to FIGS. 3A through 3C), the insulating layer 130 (refer to FIGS. 3A through 3C), and the first conductive layer 140 of the region without the photoresist portion (corresponding to PR11 of FIGS. 2A through 2C) in FIGS. 3A through 3C are first etched to form the semiconductor layer 122 and the gate insulating layer 131.

Here, in the method of manufacturing a TFT according to the present embodiment, when the semiconductor layer 122 is formed by etching the polycrystalline silicon layer 121 (refer to FIGS. 3A through 3C), the semiconductor layer 122 is etched further as compared to the first conductive layer 140 and the gate insulating layer 131, so that a width (refer to Gy in FIGS. 4A through 4C) of the gate electrode 141 (refer to FIGS. 6A through 6C) in a Y-axis direction is greater than a width (refer to Sy in FIGS. 4A through 4C) of the semiconductor layer 122 in the Y-axis direction by a predetermined difference, as described in detail below. In other words, an undercut is formed in the semiconductor layer as compared to the overlying gate insulating layer 131 and the first conductive layer 140 as a result of the etching process.

Figure 5A:
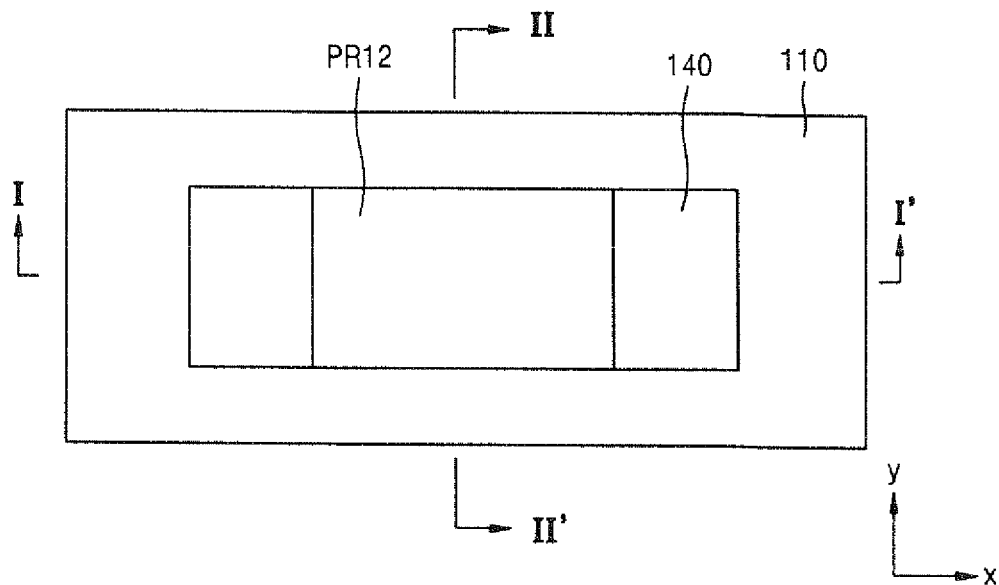
Figure 5B:
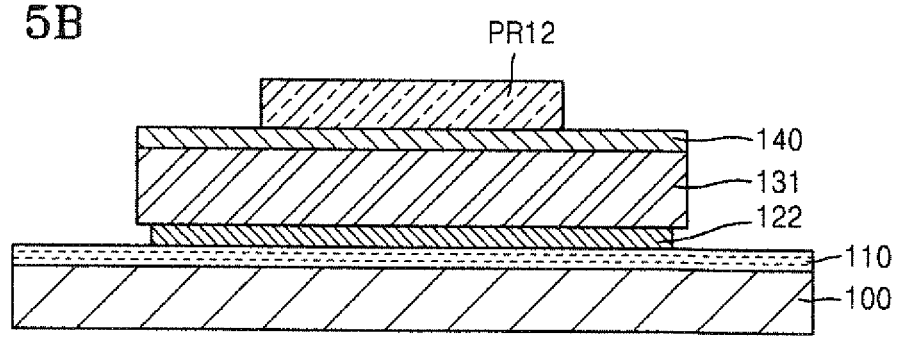
Figure 5C:
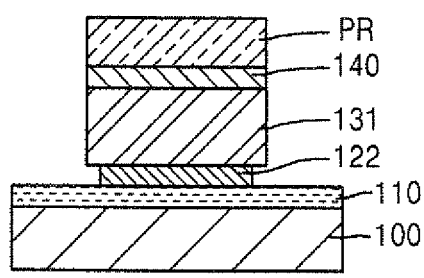

Next, referring to FIGS. 5A through 5C, when a second etching process is performed, the photoresist portion PR13 of FIGS. 3A through 3C, which corresponds to the light-transflecting portion M13 of FIGS. 2A through 2C, is etched but the underlying structure remains. In addition, a portion of the photoresist portion PR12 which corresponds to the light-blocking portion M12, remains after the second etching process, and a third etching process is performed by using the portion of the photoresist portion PR12 as a mask. In the third etching process, first conductive layer 140 is further patterned to produce gate electrode 141. During this third etch, photoresist portion PR12 is used as an etch mask and is arranged to correspond to gate electrode 141. The resultant of the third etching process (not illustrated) is photoresist portion PR12 arranged on top of and coincident with gate electrode 141.

Figure 6A:
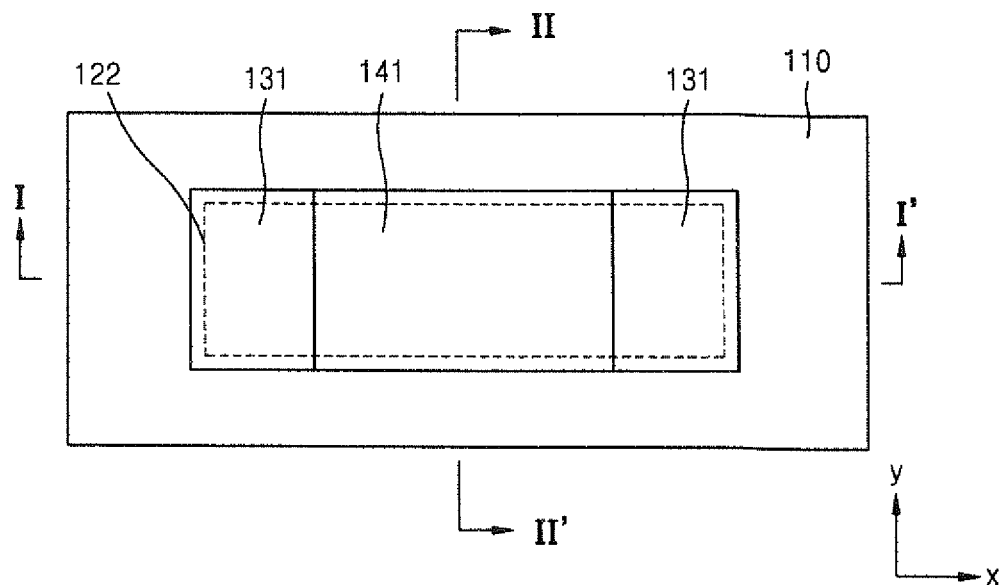
Figure 6B:
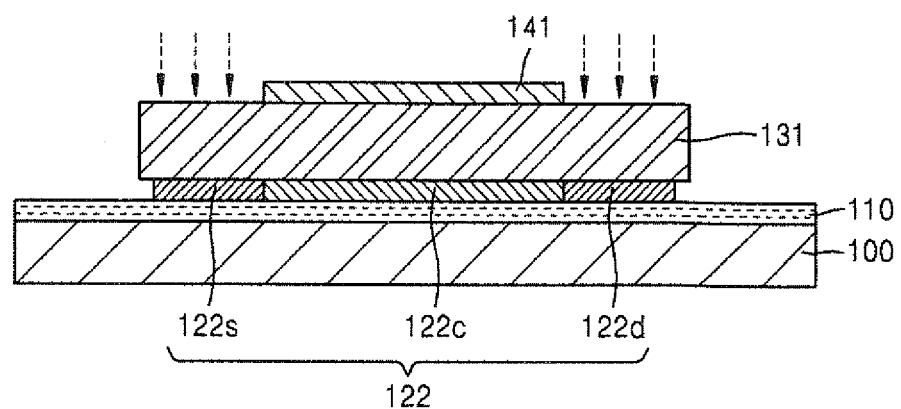
Figure 6C:
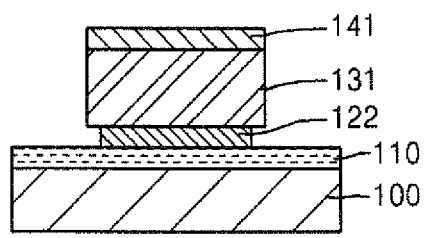

Next, FIGS. 6A through 6C illustrate a structure in which the remaining photoresist portion PR12 of FIGS. 5A through 5C is all etched after the third etching process is performed. In particular, the first conductive layer 140 (FIGS. 5A through 5C) of a region without photoresist (refer to PR13 of FIGS. 4A through 4C) is etched, so that a non-etched region of the first conductive layer 140 is formed as the gate electrode 141 of the TFT.

Referring to FIGS. 2A through 6C, the semiconductor layer 122, the gate insulating layer 131, and the gate electrode 141 of the TFT are simultaneously patterned on the same structure by using one mask (refer to the first mask M1). Since the semiconductor layer 122, the gate insulating layer 131, and the gate electrode 141 of the TFT are simultaneously patterned by using the one same mask, a manufacturing process may be simplified.

Referring to FIGS. 6A through 6C, a doping operation is performed on the semiconductor layer 122 to form a source region 122s and a drain region 122d. In more detail, the semiconductor layer 122 may include a channel region 122c between the source region 122s and the drain region 122d, the channel region 122c remaining undoped and being absent of any impurities, while the source and drain regions 122s and 122d are doped with an impurity. That is, portions of the semiconductor layer 122 are doped with an N-type impurity or a P-type impurity by using the gate electrode 141 as a self-align doping mask. The channel region 122c is overlapped by the gate electrode 141, and as a result, does not receive any dopants. The source and drain regions 122s and 122d indicate regions in which the gate electrode 141 does not overlap with the semiconductor layer 122 and in which the doping operation is performed. Electrons or holes move from the source region 122s to the drain region 122d or move from the drain region 122d to the source region 122s.

The present embodiment is characterized in that the doping operation is performed only on the source region 122s and the drain region 122d because the width Gy of the gate electrode 141 is greater than the width Sy of the semiconductor layer 122 in a direction (that is, the Y-axis direction) crossing a movement direction (that is, an X-axis direction) of the electrons or the holes in the semiconductor layer 122. This is due to the undercut in semiconductor layer 122 created by the first etching process.

In general, in a case where the semiconductor layer 122, the gate insulating layer 131, and the gate electrode 141 are formed by simultaneously patterning the polycrystalline silicon layer 121, the insulating layer 130, and the first conductive layer 140 by using the half-tone mask as in the present embodiment, it is possible for a small portion of the semiconductor layer 122 to protrude out beyond a side edge of the gate electrode 141. In this scenario, if the semiconductor layer 122 is then doped to form the source and drain regions 122s and 122d, the channel region 122c of the semiconductor layer 122, which could protrude with respect to the side edge of the gate electrode 141, may also be doped with an impurity, which may deteriorate device characteristics of a resultant TFT.

In order to prevent this problem, according to the present embodiment, the semiconductor layer 122 is further etched by a predetermined difference, compared to the first conductive layer 140 and the insulating layer 130, so that a width of the gate electrode 141 in the Y-axis direction is greater than a width of the semiconductor layer 122 in the Y-axis direction, and thus the gate electrode 141 completely covers the channel region 122c of the semiconductor layer 122. By doing so, there is no possibility that the channel region 122c can be doped with an impurity. That is, the width Gy of the gate electrode 141 in the Y-axis direction is greater than the width Sy of the semiconductor layer 122 in the Y-axis direction by the predetermined difference. The feature of further etching the semiconductor layer 122, compared to the first conductive layer 140 and the insulating layer 130, may be performed by appropriately adjusting an etching solution of the polycrystalline silicon layer 121 (refer to FIGS. 3A through 3C). A detailed description regarding the etching process is omitted.

As described above, by not allowing any portion of the channel region 122c of the semiconductor layer 122 to be doped with an impurity, it is possible to prevent deterioration of device characteristics due to an inadvertent electrical connection between the source region 122s and the drain region 122d.

Figure 7A:
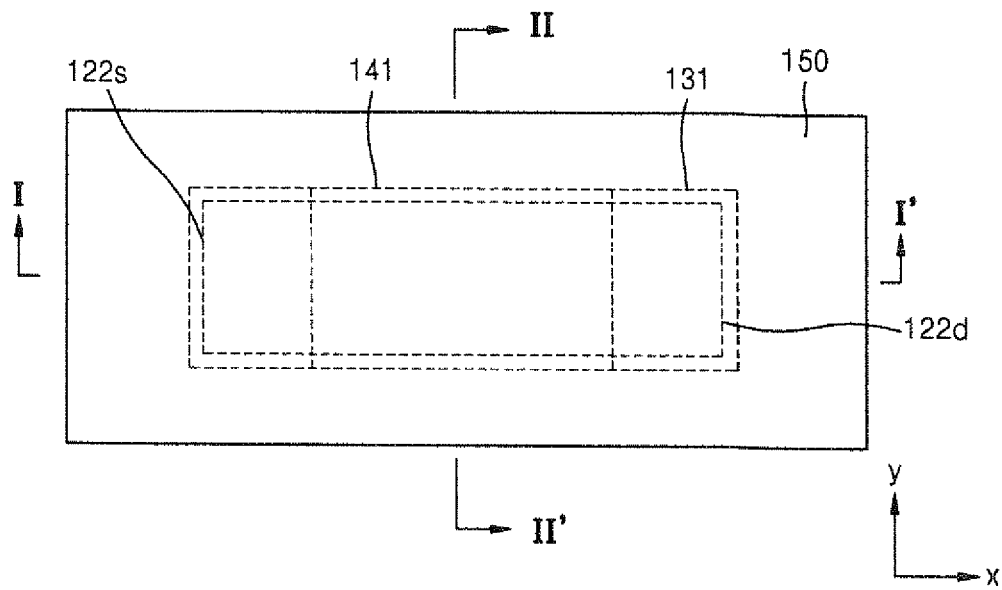
Figure 7B:
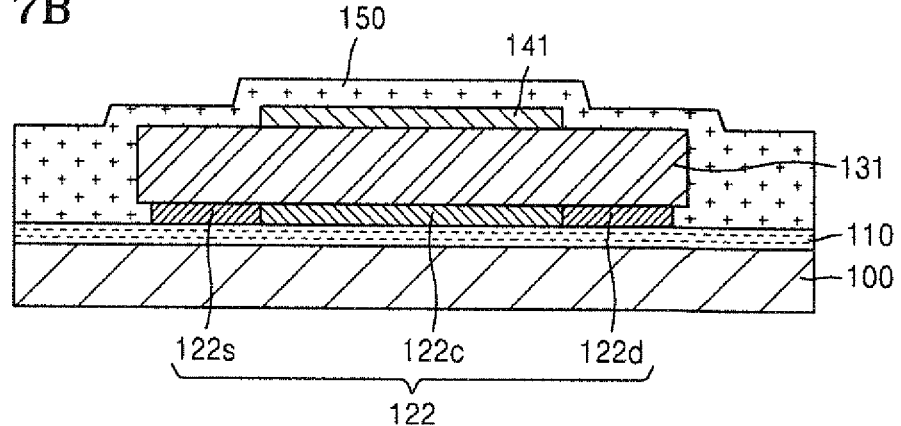
Figure 7C:
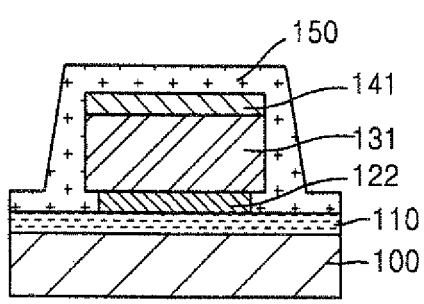

Next, referring to FIGS. 7A through 7C, an interlayer insulating layer 150 is formed on the gate electrode 141 and the gate insulating layer 131 to cover the gate electrode 141 and the gate insulating layer 131. Here, the interlayer insulating layer 150 may be formed as a single layer or a plurality of layers including an inorganic insulating layer such as silicon oxide, silicon nitride, or the like.

Figure 8A:
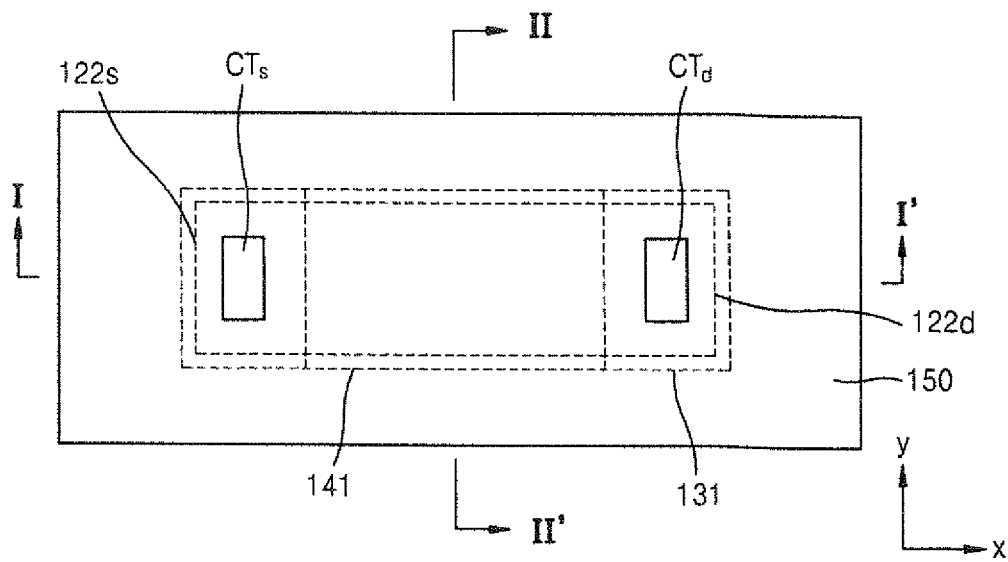
Figure 8B:
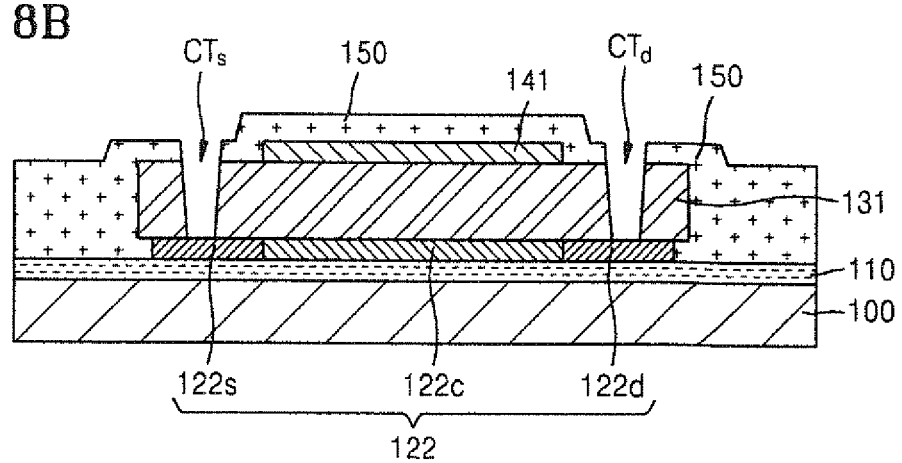
Figure 8C:
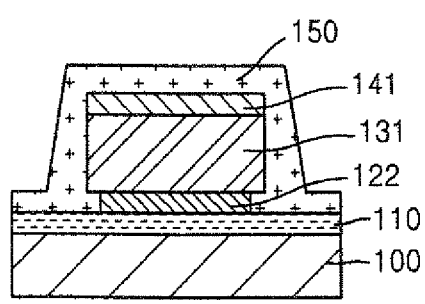

Next, referring to FIGS. 8A through 8C, contact holes CTs and CTd are formed in the interlayer insulating layer 150 and the gate insulating layer 131 to expose the source and drain regions 122s and 122d of semiconductor layer 122. In order to form the contact holes CTs and CTd, an etching solution for etching an insulting layer may be used.

Figure 9A:
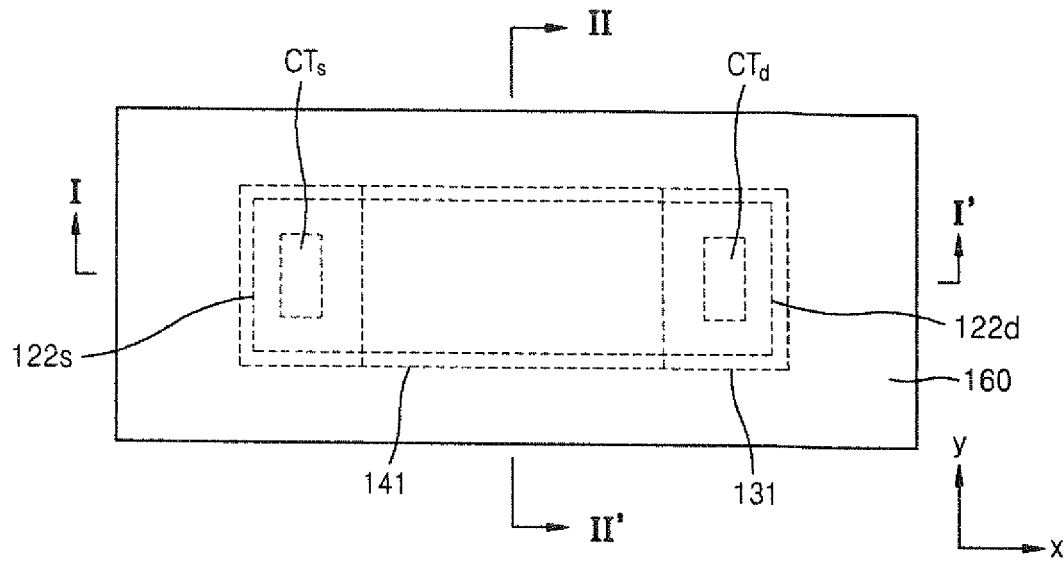
Figure 9B:
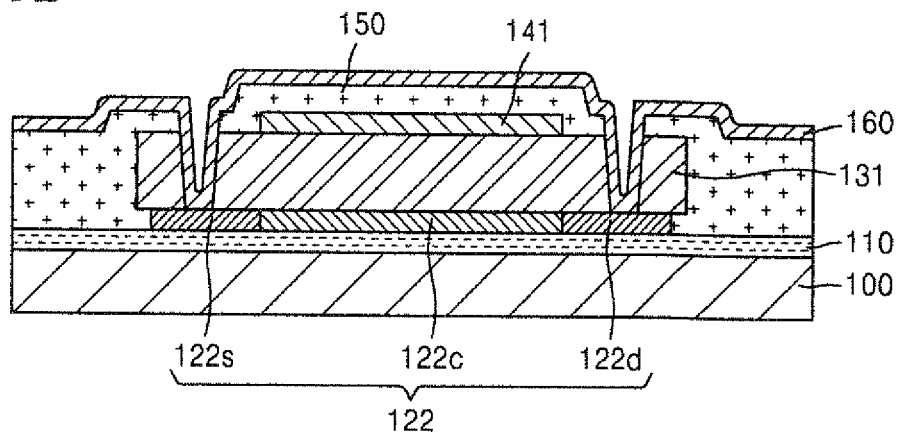
Figure 9C:
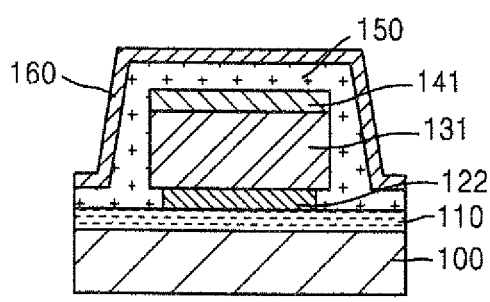
Figure 10A:
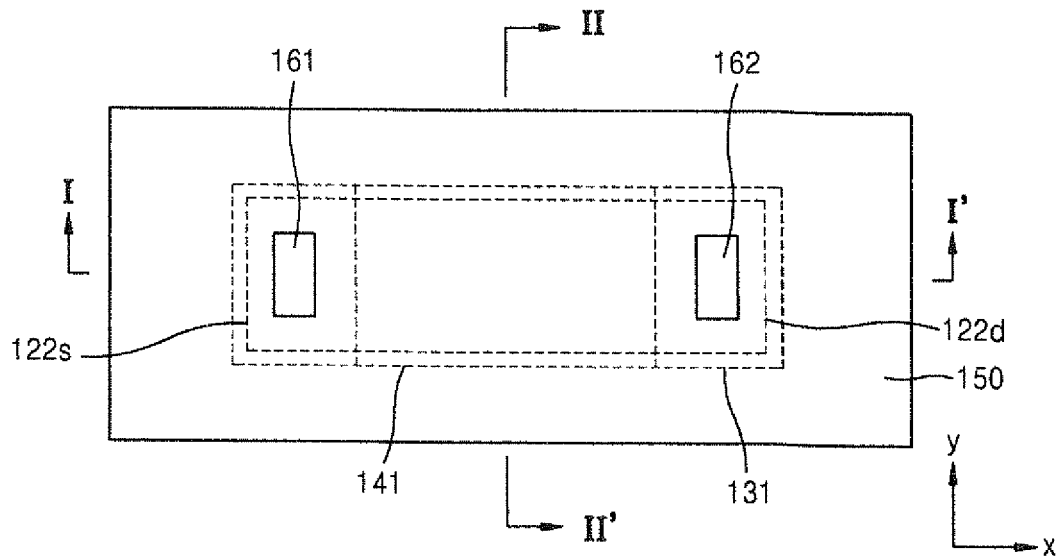
Figure 10B:
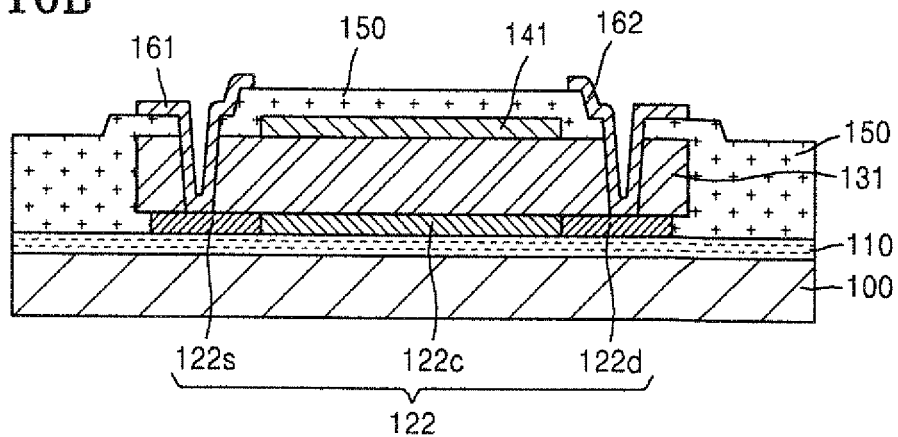
Figure 10C:
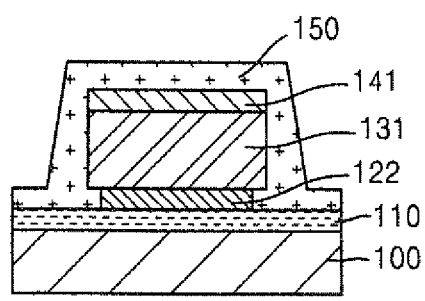

Next, referring to FIGS. 9A through 10C, a source electrode 161 and a drain electrode 162 are formed. In more detail, as illustrated in FIGS. 9A through 9C, a second conductive layer 160 is deposited and may be composed of a single layer or a plurality of layers that includes a low-resistance metal material layer on the interlayer insulating layer 150 and in the contact holes Cts and CTd. Afterward, the second conductive layer 160 is patterned to form the source electrode 161 and the drain electrode 162. Here, the source electrode 161 and the drain electrode 162 are electrically connected to the source region 122s and the drain region 122d, respectively, via the contact holes CTs and Ctd.

Figure 11:
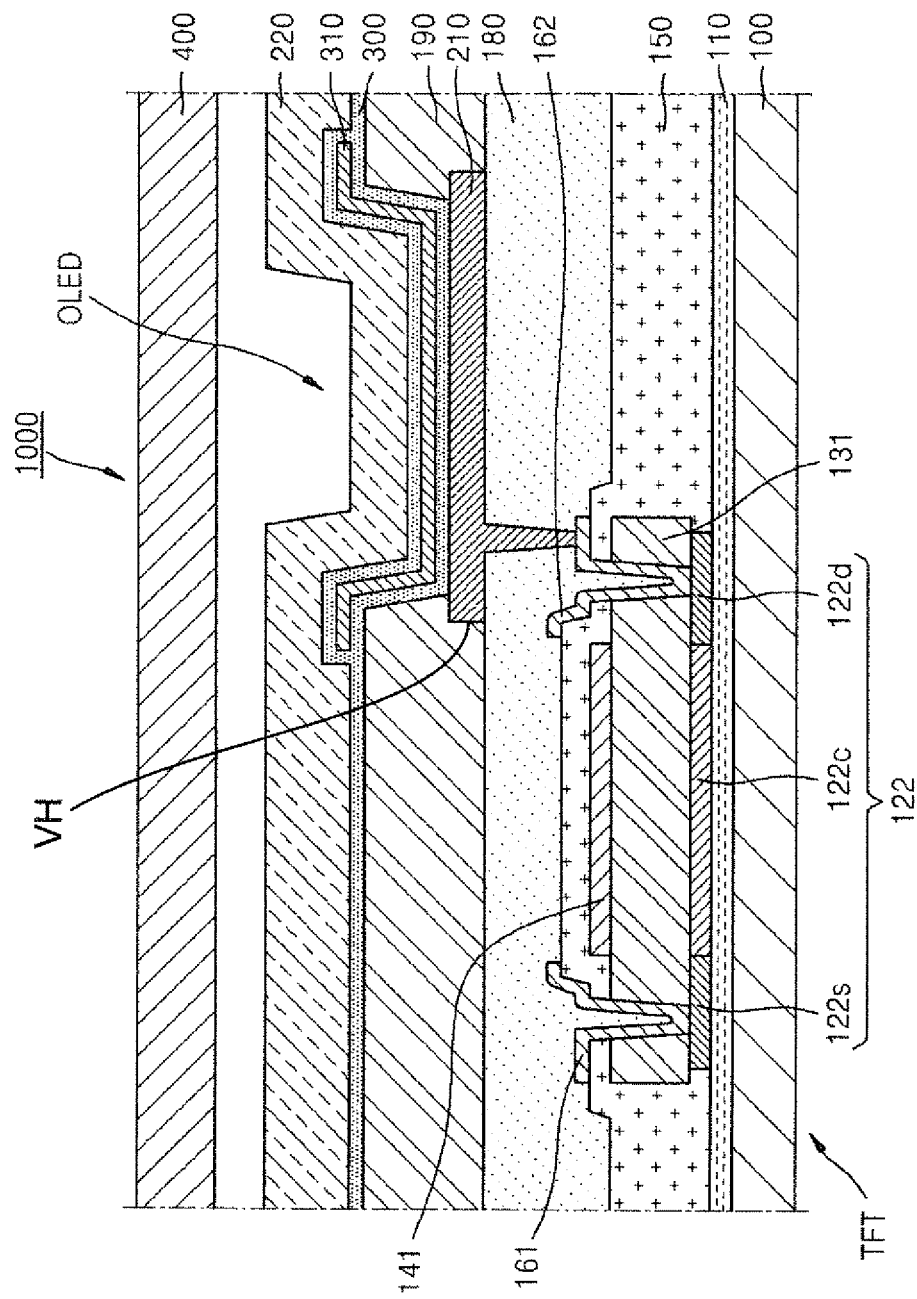
FIG. 11 is a cross-sectional view illustrating a method of manufacturing an organic light-emitting display apparatus, according to an embodiment of the present invention.

Turning now to FIG. 11, FIG. 11 is a cross-sectional view illustrating a method of manufacturing an organic light-emitting display apparatus 1000 according to an embodiment of the present invention. The organic light-emitting display apparatus 1000 includes a plurality of pixels, each of which includes a circuit unit and an emission unit. The circuit unit includes at least one TFT, and the emission unit that is electrically connected to the circuit unit includes an organic light-emitting diode (OLED). The OLED may include a pixel electrode 210 functioning as an anode, an opposite electrode 220 functioning as a cathode, and an intermediate layer 300 interposed between the pixel electrode 210 and the opposite electrode 220. However, one or more embodiments are not limited thereto and thus the pixel electrode 210 may be a cathode and the opposite electrode 220 may be an anode. According to the emission type of the organic light-emitting display apparatus 1000, when the organic light-emitting display apparatus 1000 is a top-emission type display apparatus, the emission unit may be disposed to block the circuit unit. When the organic light-emitting display apparatus 1000 is a bottom-emission type display apparatus or a dual-emission type display apparatus, the emission unit may be disposed to not block the circuit unit.

Since the method of manufacturing a TFT included in the organic light-emitting display apparatus 1000 is described above with reference to FIGS. 1A through 10C, hereinafter, processes thereafter only will be further described.

Referring to FIG. 11, a planarization layer 180 is formed on the interlayer insulating layer 150 to cover the TFT. The planarization layer 180 may be a single layer or a plurality of layers that have a top planarized surface. The planarization layer 180 may be formed of an inorganic material and/or an organic material.

Then, a via-hole VH is formed by penetrating the planarization layer 180 until one of the source electrode or the drain electrode 162 of the TFT is exposed (FIG. 11 shows the drain electrode being exposed). A third conductive layer is then deposited on the planarization layer 180 and in the via hole VH. Then, the third conductive layer is patterned to produce pixel electrode 210. Since the pixel electrode 210 fills via hole VH, the pixel electrode is electrically connected to the TFT.

A pixel defining layer (PDL) 190 is formed on the planarization layer 180 to cover side edges of the pixel electrode 210. The PDL 190 functions to define a pixel by covering the side edges of the pixel electrode 210 with a predetermined thickness. Also, the PDL 190 functions to prevent occurrence of an arc at an end of the pixel electrode 210 by increasing a distance between the end of the pixel electrode 210 and the opposite electrode 220 to be described below.

The intermediate layer 300 including an emission layer (EML) 310, and the opposite electrode 220 are sequentially formed on the pixel electrode 210. The intermediate layer 300 may be made out of a small-molecule organic layer or a polymer organic layer. When the intermediate layer 300 is formed as the small-molecule organic layer, the intermediate layer 300 may have a structure in which a Hole Injection Layer (HIL), a Hole Transport Layer (HTL), the EML 310, an Electron Transport Layer (ETL), an Electron Injection Layer (EIL), or the like are singularly or multiply stacked, and may be formed by using one of various organic materials including copper phthalocyanine (CuPc), N,N'-Di(naphthalene-1-yl)-N,N'-diphenyl-benzidine (NPB), tris-8-hydroxyquinoline aluminum) (Alq3), or the like.

When the intermediate layer 300 is made out of a polymer organic layer, the intermediate layer 300 may include only a HTL between the pixel electrode 210 and the EML 310. The HTL may be made out of poly-(2,4)-ethylene-dihydroxy thiophene (PEDOT), polyaniline (PANI), or the like. Here, the EML 310 may be arranged in each of red, green, and blue pixels, and the HIL, the HTL, the ETL, the EIL are common layers that are commonly applied to each of the red, green, and blue pixels.

An encapsulation substrate 400 prevents external air and moisture from penetrating into the intermediate layer 300 including the EML 310. Side edges of the substrate 100 and the encapsulation substrate 400 may be combined by an encapsulating member (not shown).

Although an organic light-emitting display apparatus is described in the above as a display apparatus including the TFT according to the present embodiment, one or more embodiments of the present invention are not limited thereto. Thus, the one or more embodiments of the present invention may be applied to other types of display apparatuses, including a liquid crystal display (LCD) apparatus, plasma display panel (PDP) apparatus, etc.

According to the one or more embodiments of the present invention, electrical characteristics of the TFT may be improved by preventing the channel region of the semiconductor layer from being doped with an impurity. In addition, by simultaneously patterning the semiconductor layer, the gate insulating layer, and the gate electrode, the manufacturing process may be simplified, and the manufacturing time and costs may be decreased. Further, by depositing each of the amorphous silicon layer 120, the insulating layer 130 and the first conductive layer 140 in one deposition process, the semiconductor layer 122 can be prevented from being contaminated since neither a photoresist layer nor a oxygen can come into contact with it.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing a thin film transistor (TFT), comprising:

forming a buffer layer, an amorphous silicon layer, an insulating layer, and a first conductive layer on a substrate;

forming a polycrystalline silicon layer by crystallizing the amorphous silicon layer;

forming a semiconductor layer, a gate insulating layer, and a gate electrode that have a predetermined shape by simultaneously patterning the polycrystalline silicon layer, the insulating layer, and the first conductive layer, wherein the polycrystalline silicon layer is further etched to produce an undercut recessed a distance compared to sidewalls of the insulating layer and the first conductive layer, wherein a width of the gate electrode is greater than a width of the semiconductor layer in a direction (a Y-axis direction) orthogonal to a direction (an X-axis direction) that a source region, a channel region and a drain region are to be arranged;

forming the source region and the drain region within the semiconductor layer by doping corresponding portions of the semiconductor layer, the gate electrode corresponding to the channel region of the semiconductor layer that remains undoped, the gate electrode serves as a doping mask during the doping of the semiconductor layer;

forming an interlayer insulating layer on the gate electrode, the interlayer insulating layer covering the gate insulating layer; and forming a source electrode and a drain electrode that are electrically connected to the source region and the drain region respectively.

2. The method of claim 1, wherein the forming of the semiconductor layer, the gate insulating layer, and the gate electrode comprises using a half-tone mask comprising light-transflecting portions arranged at locations that correspond to the source region and the drain region, respectively.

3. The method of claim 1, wherein the amorphous silicon layer is crystallized into the polycrystalline silicon layer via a process selected from a group consisting of a Solid Phase Crystallization (SPC) process, a Metal-Induced Crystallization (MIC) process, a Super Grain Silicon (SGS) crystallization process, and a Joule-heating Induced Crystallization (JIC) process.

4. The method of claim 1, wherein the forming of the source and drain electrodes comprises:

exposing the source and drain regions by forming contact holes in the interlayer insulating layer and in the gate insulating layer;

forming a second conductive layer on the interlayer insulating layer and within the contact holes; and patterning the second conductive layer.

5. The method of claim 1, wherein the buffer layer, the semiconductor layer, the insulating layer, and the first conductive layer are deposited in order and patterned simultaneously by a single etching process.

6. The method of claim 1, wherein the buffer layer comprises at least one material selected from a group consisting of silicon oxide, silicon nitride and silicon oxynitride.

7. The method of claim 1, wherein the substrate is an insulating substrate comprising a transparent glass material.

8. The method of claim 1, wherein when the polycrystalline silicon layer, the insulating layer and the first conductive layer are patterned simultaneously, the insulating layer and the first conductive layer have a same island shape while the patterned polycrystalline silicon layer has a shape slightly smaller than that of the insulating layer and the first conductive layer while being arranged concentric with the insulating layer and the first conductive layer.

9. The method of claim 1, wherein the gate electrode is comprised of a material selected from a group consisting of Ag, Mg, Al, Pt, Au, Ni, Nd, Ir, Cr, Li, Ca, Mo, Ti, W, MoW, Al/Cu, indium tin oxide (ITO), indium zinc oxide (IZO), ZnO and $In_2O_3$.

10. A method of manufacturing an organic light-emitting display apparatus, comprising:

forming a buffer layer, an amorphous silicon layer, an insulating layer, and a first conductive layer on a substrate;

forming a polycrystalline silicon layer by crystallizing the amorphous silicon layer;

forming a semiconductor layer, a gate insulating layer, and a gate electrode that have a predetermined shape by simultaneously patterning the polycrystalline silicon layer, the insulating layer, and the first conductive layer, wherein the polycrystalline silicon layer is further etched laterally to produce an undercut recessed by a predetermined distance as compared to corresponding sidewalls of the insulating layer and the first conductive layer, wherein a width of the gate electrode is greater than a width of the semiconductor layer in a direction (a Y-axis direction) orthogonal to a direction (an X-axis direction) that a source region, a channel region and a drain region are to be arranged;

forming the source region and the drain region in the semiconductor layer by doping corresponding portions of the semiconductor layer, the gate electrode corresponding to the channel region of the semiconductor layer that remains undoped, the gate electrode serves as a doping mask during the doping of the semiconductor layer;

forming an interlayer insulating layer on the gate electrode to cover the gate insulating layer;

forming a source electrode and a drain electrode that are electrically connected to the source region and the drain region respectively;

forming a pixel electrode that is electrically connected to one of the source electrode and the drain electrode;

forming an intermediate layer on the pixel electrode, the intermediate layer including an emission layer (EML); and forming an opposite electrode on the intermediate layer.

11. The method of claim 10, wherein the forming of the semiconductor layer, the gate insulating layer, and the gate electrode comprises using a half-tone mask comprising light-transflecting portions arranged at locations that correspond to the source region and the drain region, respectively.

12. The method of claim 10, wherein the forming of the source electrode and the drain electrode comprises:

exposing the source and drain regions by forming contact holes in the interlayer insulating layer and in the gate insulating layer;

forming a second conductive layer on the interlayer insulating layer and within the contact holes; and patterning the second conductive layer.

13. The method of claim 10, wherein the forming of the pixel electrode comprises:

forming a planarization layer on the interlayer insulating layer to cover the source electrode and the drain electrode;

exposing one of the source electrode and the drain electrode by forming a via-hole in the planarization layer; and depositing a metal material on the planarization layer and in the via hole, wherein the pixel electrode is electrically connected to the one of the source electrode and the drain electrode via the via-hole.

14. The method of claim 10, wherein the depositing of the buffer layer, the semiconductor layer, the insulating layer, and the first conductive layer are deposited in order and patterned simultaneously by a single etching process.

15. The method of claim 10, wherein the amorphous silicon layer is crystallized into the polycrystalline silicon layer using a process selected from a group consisting of a Solid Phase Crystallization (SPC) process, a Metal-Induced Crystallization (MIC) process, a Super Grain Silicon (SGS) crystallization process and a Joule-heating Induced Crystallization (JIC) process.

16. The method of claim 10, wherein the substrate is an insulating substrate comprising a transparent glass material.

17. The method of claim 10, wherein when the polycrystalline silicon layer, the insulating layer and the first conductive layer are patterned simultaneously, the insulating layer and the first conductive layer have a same island shape while the patterned polycrystalline silicon layer has a shape slightly smaller than that of the insulating layer and the first conductive layer while being arranged concentric with the insulating layer and the first conductive layer.

18. The method of claim 10, wherein the gate electrode is comprised of a material selected from a group consisting of Ag, Mg, Al, Pt, Au, Ni, Nd, Ir, Cr, Li, Ca, Mo, Ti, W, MoW, Al/Cu, indium tin oxide (ITO), indium zinc oxide (IZO), ZnO and $In_2O_3$.

* * * * *